(12) United States Patent
Koga (10) Patent No.: US 7,595,992 B2
(45) Date of Patent: Sep. 29, 2009

(54) SUBSTRATE UNIT, COOLING DEVICE, AND ELECTRONIC DEVICE

(75) Inventor: Yuuichi Koga, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 416 days.

(21) Appl. No.: 11/701,251

(22) Filed: Feb. 1, 2007

(65) Prior Publication Data

US 2007/0200190 A1 Aug. 30, 2007

(30) Foreign Application Priority Data

Feb. 28, 2006 (JP) ............... 2006-051960

(51) Int. Cl.
*H05K 7/20* (2006.01)
(52) U.S. Cl. ............ 361/719; 361/679.47; 361/679.52; 361/700; 361/704; 174/15.1; 174/15.2; 165/80.3; 165/80.4; 165/104.33
(58) Field of Classification Search ............ None
See application file for complete search history.

(56) References Cited

U.S. PATENT DOCUMENTS

| 5,581,443 | A | | 12/1996 | Nakamura |
| 5,731,952 | A | | 3/1998 | Ohgami |
| 5,748,444 | A | * | 5/1998 | Honda et al. ........... 361/679.09 |
| 5,784,256 | A | | 7/1998 | Nakamura |
| 5,923,530 | A | * | 7/1999 | Murayama et al. ..... 361/679.09 |
| 6,043,977 | A | * | 3/2000 | Nakajima ............... 361/679.48 |
| 6,094,343 | A | * | 7/2000 | Nakagawa et al. ..... 361/679.46 |
| 6,449,149 | B1 | * | 9/2002 | Ohashi et al. .......... 361/679.46 |
| 6,865,082 | B2 | * | 3/2005 | Huang et al. ................. 361/700 |

FOREIGN PATENT DOCUMENTS

| JP | 8-222671 | 8/1996 |
| JP | 2004-126861 | 4/2004 |

* cited by examiner

*Primary Examiner*—Boris L Chervinsky
(74) *Attorney, Agent, or Firm*—Knobbe, Martens, Olson & Bear, LLP (57) ABSTRACT

According to one embodiment, a substrate unit of the present invention comprises a first substrate, a second substrate and a coupling member. The first substrate has a first substrate main body and a circuit component. The second substrate has a second substrate main body, an opening portion provided at the second substrate main body, and a cooling module which cools the circuit component. The circuit component is mounted on a face of the first substrate main body which is opposite to the second substrate. The cooling module has a main body and a projecting portion. The coupling member fixes the main body to a second face of the second substrate main body, and couples the first substrate and the second substrate so as to fit the projecting portion in the opening portion and press the projecting portion against the circuit component.

20 Claims, 7 Drawing Sheets

FIG. 8

SUBSTRATE UNIT, COOLING DEVICE, AND ELECTRONIC DEVICE

CROSS-REFERENCE TO RELATED APPLICATIONS

This application is based upon and claims the benefit of priority from Japanese Patent Application No. 2006-051960, filed Feb. 28, 2006, the entire contents of which are incorporated herein by reference.

BACKGROUND

1. Field

One embodiment of the invention relates to a substrate unit comprising a plurality of substrates, a cooling device comprising the substrate unit, and an electronic device.

2. Description of the Related Art

For example, Jpn. Pat. Appln. KOKAI Publication No. 8-222671 discloses a substrate which is mounted on an electronic device and which comprises a cooling member cooling an element provided on the substrate. This substrate comprises a main body, an circuit component mounted on the main body, a cooling member fixed on the main body to cool the element, and a cover making a close contact between the circuit component and the cooling member.

The main body of the substrate has an opening below a location at which the circuit component is mounted. The cooling member has a distal end passing through the opening, and is fixed on a face opposite to the face on which the circuit component is fixed, on the main body of the substrate. The distal end passing through the opening abuts on the circuit component from a lower side. The cover presses the circuit component from an upper side. The cover has an elastic member at a portion abutting on the circuit component, and makes a close contact between the circuit component and the cooling member by the elastic member. Thus, the circuit component and the cooling member are mounted on the single substrate, in the conventional cooling device.

To conduct an operation of repairing or exchanging the circuit component on the conventional substrate, it is necessary to detach the substrate from the electronic device and remove the cooling member and the cover from the main body of the substrate. For this reason, the operation is complicated. In addition, the thickness of the substrate is increased in accordance with providing the cooling member and the cover on the substrate.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, according to one embodiment, a substrate unit of the present invention comprises a first substrate, a second substrate and a coupling member. The first substrate has a first substrate main body and a circuit component. The second substrate has a second substrate main body, an opening portion provided at the second substrate main body, and a cooling module which cools the circuit component. The circuit component is mounted on a face of the first substrate main body which is opposite to the second substrate. The cooling module has a main body and a projecting portion. The coupling member fixes the main body to a second face of the second substrate main body, and couples the first substrate and the second substrate so as to fit the projecting portion in the opening portion and press the projecting portion against the circuit component.

A cooling device according to a first embodiment, and an electronic device comprising the cooling device are described below.

Figure 1:
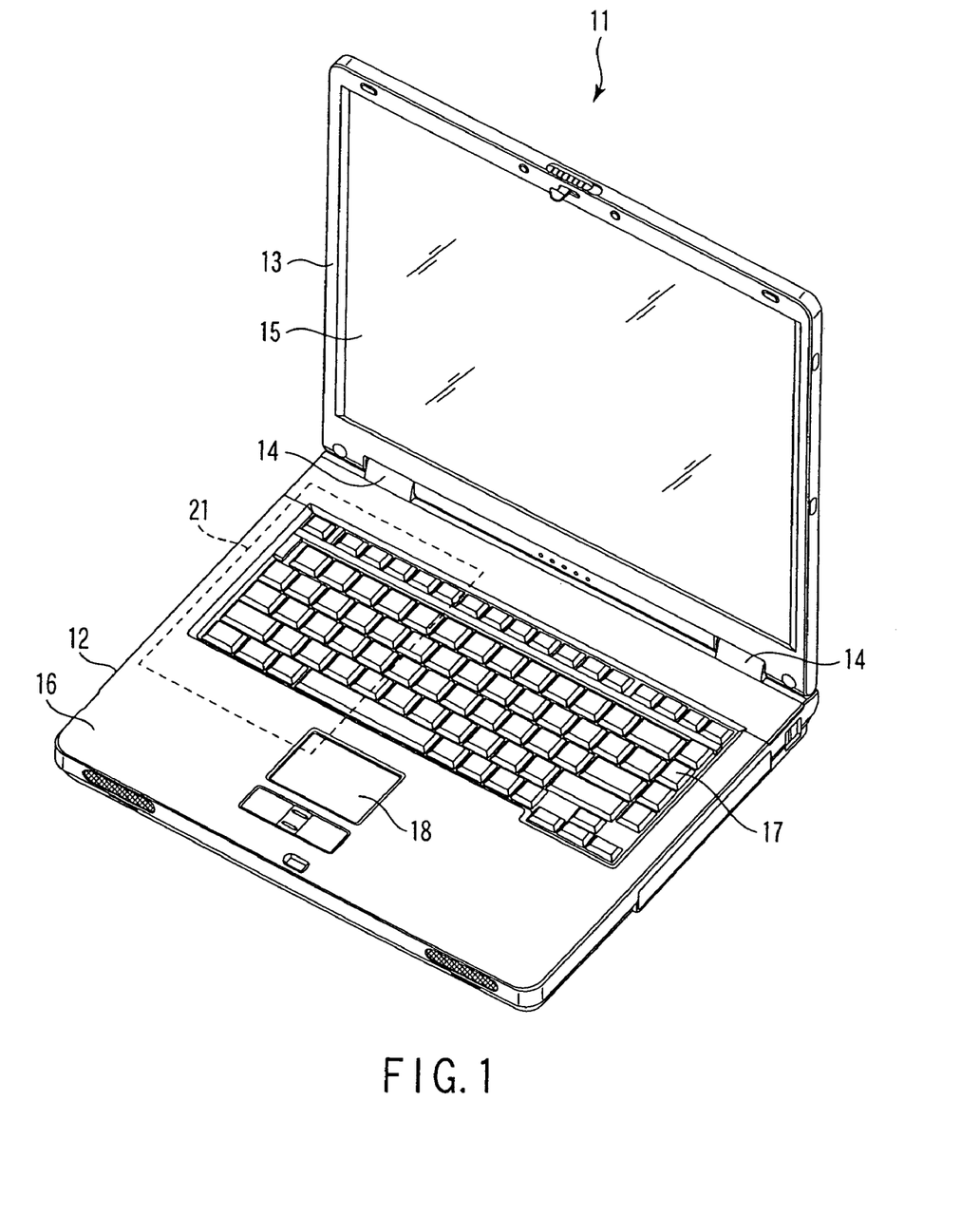
FIG. 1 is an exemplary perspective view showing a portable computer according to a first embodiment of the present invention.

A portable computer 11 which is an example of the electronic device comprises a main body 12, a display unit 13, and a hinge 14 as shown in FIG. 1. The display unit 13 has a display unit 15. The hinge 14 supports the display unit 13 such that the display unit 13 can freely pivot around the main body 12. The main body 12 has a housing 16, a keyboard 17, and a touch pad 18. A cooling device 21 is contained inside the housing 16.

Figure 2:
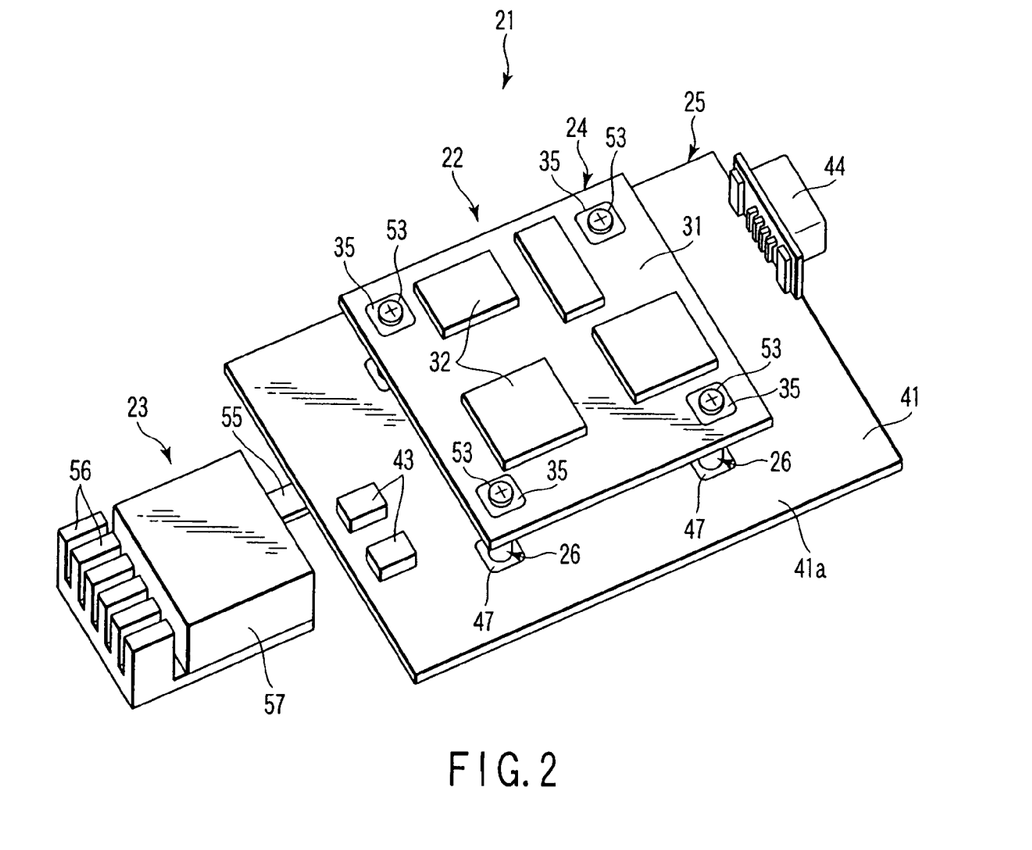
FIG. 2 is an exemplary perspective view showing a cooling device contained in a housing of the portable computer shown in FIG. 1.
Figure 3:
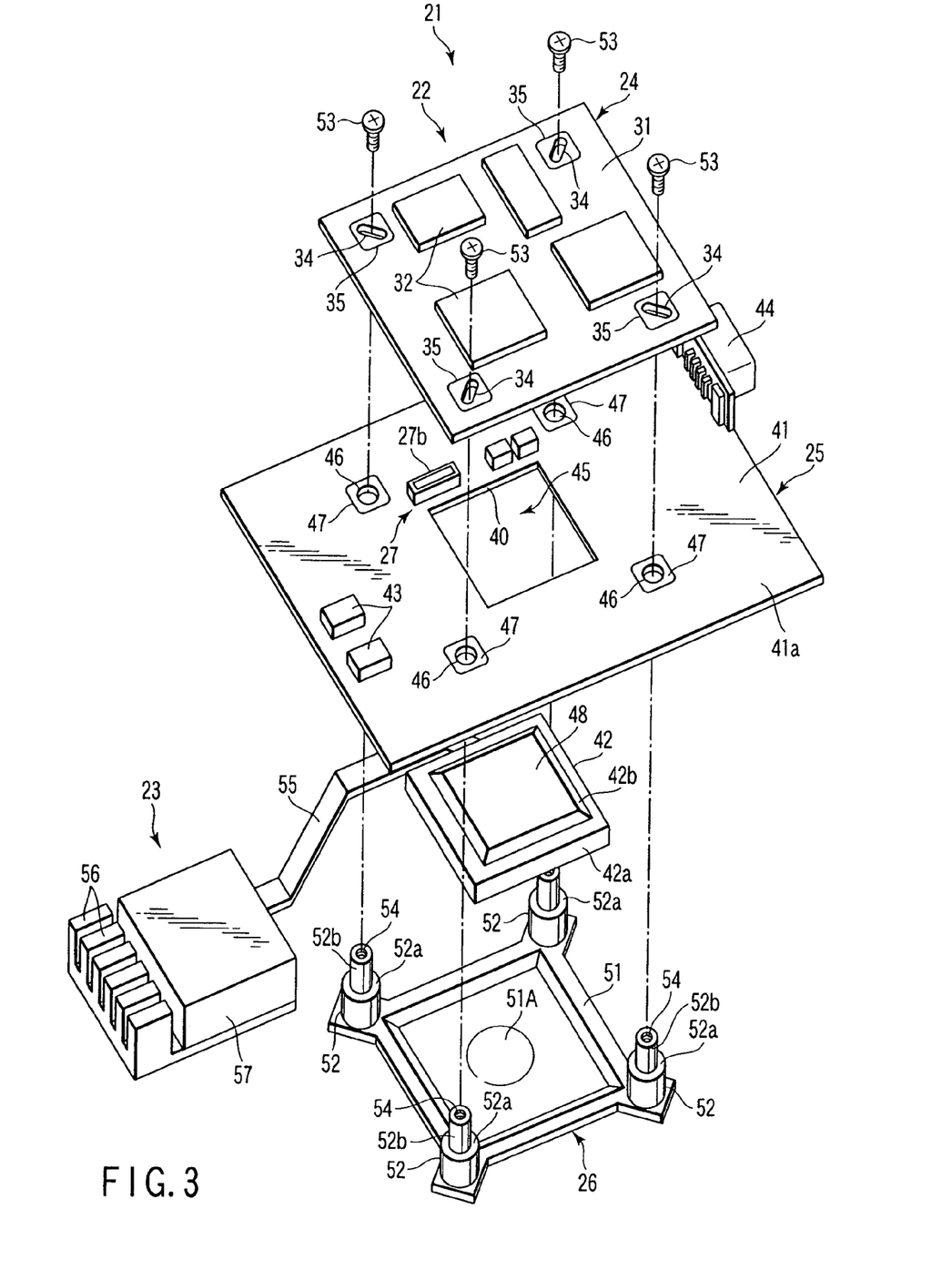
FIG. 3 is an exemplary exploded perspective view showing the cooling device shown in FIG. 2 as seen from an upper side.
Figure 4:
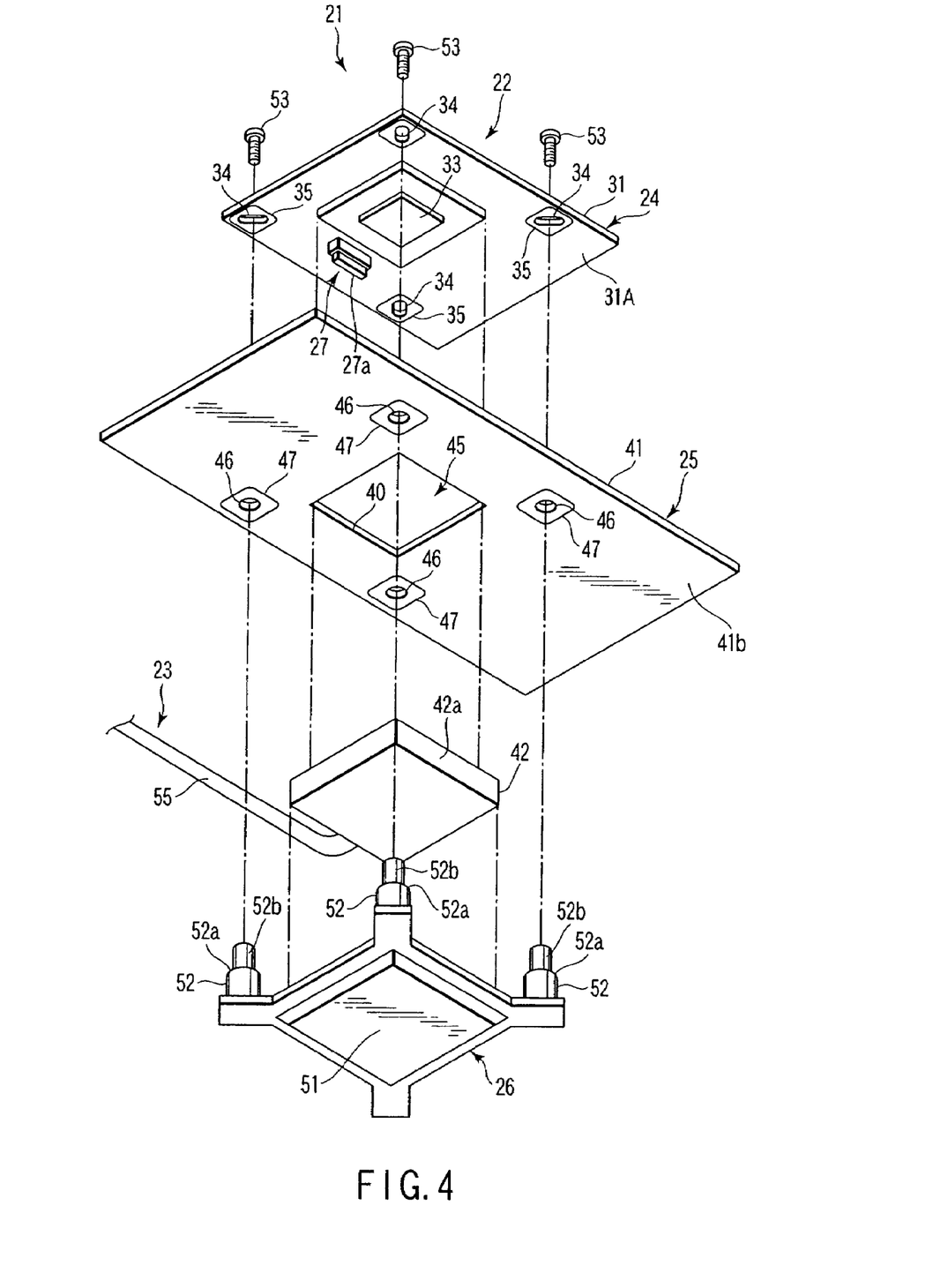
FIG. 4 is an exemplary exploded perspective view showing the cooling device shown in FIG. 2 as seen from a lower side.

The cooling device 21 has a substrate unit 22 and a cooling unit 23 as shown in FIG. 2 to FIG. 4.

The substrate unit 22 comprises a first substrate 24, a second substrate 25, coupling member 26 coupling the first substrate 24 and the second substrate 25, and a connector 27 which makes an electric connection between the first substrate 24 and the second substrate 25. The coupling member 26 couples the first substrate 24 and the second substrate 25 such that the first substrate 24 and the second substrate 25 are arranged opposite to each other.

The first substrate 24 has a first substrate main body 31, a plurality of chip components 32, a circuit component 33, and a male connector 27a as shown in FIGS. 2 and 4. The plural chip components 32 are mounted on a top face of the first substrate main body 31. The male connector 27a is mounted on a face 31A which is opposite to the second substrate 25 of the first substrate main body 31. The male connector 27a is a part of the connector 27. The circuit component 33 is mounted on the face 31A which is opposite to the second substrate 25 of the first substrate main body 31. The circuit component 33 is an element to be cooled by the cooling unit 23. The circuit component 33 is composed of a CPU (central processing unit).

Elongated holes 34 to fix the coupling member 26 are formed at four angle portions of the first substrate main body 31. Each of the elongated holes 34 is shaped in a circle elongated in a direction extending from the angle portion to the center.

A first conductive ground portion 35 is provided at a portion which is in contact with the elongated hole 34 on the top face of the first substrate main body 31 and a portion which is in contact with the elongated hole 34 on the bottom face of the first substrate main body 31. In the present embodiment, the circuit component 33 is composed of a CPU, but may be composed of, for example, a component such as a graphics chip which emits heat.

The second substrate 25 has a second substrate main body 41 as shown in FIGS. 3 and 4. The second substrate main body 41 has a first face 41a that is opposite to the first substrate 24 and a second face 41b that is at the opposite side of the first face 41a. The second substrate 25 has a cooling module 42 serving as the cooling member, a plurality of chip components 43, an interface 44, and a female connector 27b. The plural chip components 43 are mounted on the first face 41a of the second substrate main body 41. The interface 44 is an example of an I/O port and is fixed on the first face 41a of the second substrate main body 41. The female connector 27b is fixed on the first face 41a of the second substrate main body 41.

A square opening portion 45 is provided at the center of the second substrate main body 41. The surrounding of the opening portion 45 is defined by an edge portion 40 of the second substrate main body 41.

The second substrate main body 41 has through holes 46 in which the coupling member 26 is partially fitted, at four portions corresponding to the respective elongated holes 34 of the first substrate 24. A second conductive ground portion 47 is provided at each of a portion which is in contact with the through hole 46 on the first face 41a of the second substrate main body 41 and a portion which is in contact with the through hole 46 on the second face 41b of the second substrate 25. The female connector 27b is a part of the connector 27.

The cooling module 42 serving as the cooling member is formed of an aluminum alloy having a good thermal conductivity. The cooling module 42 has a main body 42a and a projecting portion 42b which integrally projects from the main body 42a. The main body 42a is shaped in a square plate. The projecting portion 42b has a trapezoidal shape in section. The projecting portion 42b includes a flat contact face 48 abutting on the circuit component 33. The material of the cooling module 42 is not limited to this, but may be any material having a good thermal conductivity such as magnesium alloy.

The coupling member 26 comprises a plate-shaped metal stop 51 having a spring characteristic, pins 52 welded to four corners of the metal stop 51, and screws 53 for fixation of the first substrate 24, as shown in FIGS. 3 and 4. The metal stop 51 is arranged at the opposite side of the cooling module 42 to the second substrate main body 41 such that the cooling module 42 is sandwiched between the metal stop 51 and the second substrate main body 41. A hemispherical projection 51A is provided at a position corresponding to the projecting portion 42b of the cooling module 42, i.e. at a central part of the metal stop 51.

The pins 52 project from the four corners of the metal stop 51, in a direction orthogonal to the metal stop 51. Each of the pins 52 has a step portion 52a abutting on the second substrate 25, and a distal portion 52b extending from the step portion 52a and abutting on the first substrate 24 through the second substrate 25. A screw hole 54 is formed on a top face of the distal portions 52b of each pin 52 such that the screw 53 is fitted in the screw hole 54. The pins 52 and the screws 53 are formed of a conductive metal material. The first substrate 24 and the second substrate 25 are earthed by the pins 52 and the screws 53.

The cooling unit 23 comprises a heat pipe 55 communicating with the cooling module 42, cooling fins 56 communicating with the heat pipe 55, and a fan 57 blowing air toward the cooling fins 56.

Figure 5:
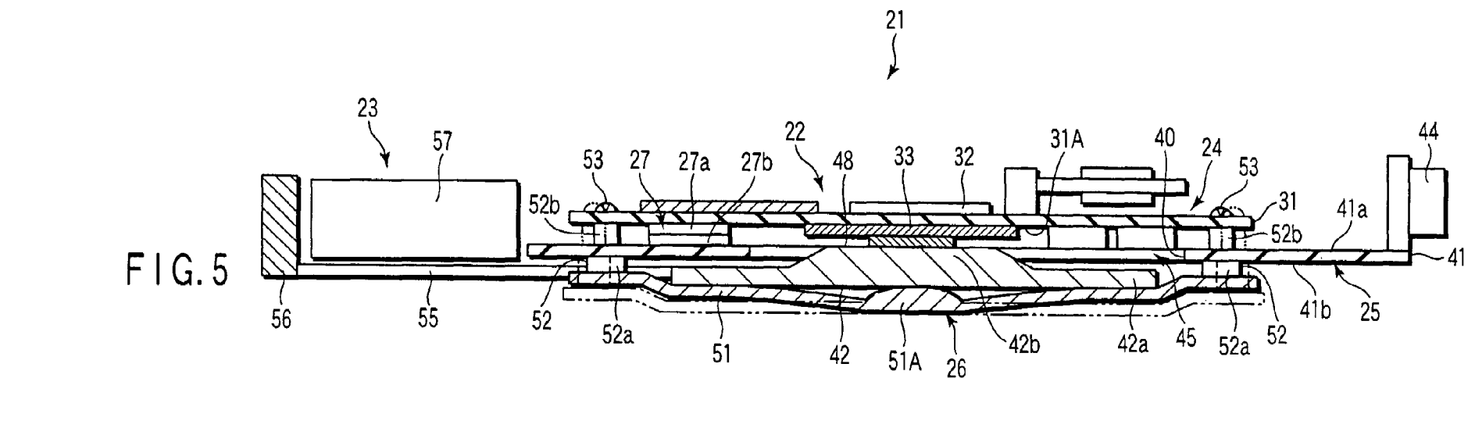
FIG. 5 is an exemplary cross-sectional view showing the cooling device shown in FIG. 2 as sectioned vertically.

FIG. 5 is a vertically sectional view of the cooling device 21. In the assembled state of the cooling device 21 as shown in FIG. 5, the coupling member 26 fixes the main body 42a of the cooling module 42 on the second face 41b of the second substrate main body 41. In addition, the coupling member 26 fits the projecting portion 42b of the cooling module 42 in the opening portion 45, and couples the first substrate 24 and the second substrate 25 so as to press the contact face 48 of the projecting portion 42b against the circuit component 33. In this state, cooling module 42 is pressed against the circuit component 33 with a predetermined pushing pressure. In this fixation state, the periphery of the circuit component 33 is surrounded by the edge portion 40 of the second substrate main body 41.

Assembling operations of the substrate unit 22 are described with reference to FIG. 3 to FIG. 5. First, the distal portions 52b of the pins 52 of the coupling member 26 are inserted into the through holes 46 of the second substrate 25 to temporarily couple the second substrate 25 and the coupling member 26, as shown in FIGS. 3 and 4. In this case, the cooling module 42 is sandwiched between the second substrate 25 and the coupling member 26. In this state, the second substrate 25 is fixed on the housing 16.

Subsequently, the first substrate 24 is fitted in the second substrate 25 from the upper side and fixed thereon. At this time, the male connector 27a of the first substrate 24 is fitted in the female connector 27b of the second substrate 25 and the first substrate 24 is thereby positioned substantially. The screws 53 are fitted in the screw holes 54 of the pins 52 through the elongated holes 34, at four corners. The metal stop 51 represented by a two-dot-chained line in FIG. 5 is deformed in a state represented by a solid line, by the screws. When the metal stop 51 is deformed, the screws 53 inserted through the elongated holes 34 slide toward the central portion of the first substrate 24.

By the fixation of the screws 53 and the deformation of the metal stop 51, the hemispherical projection 51A is pressed against the cooling module 42. Due to the pressing force of the hemispherical projection 51A, the projecting portion 42b of the cooling module 42 is pressed against the circuit component 33 with a predetermined pressing pressure. Thus, in the substrate unit 22 of the present embodiment, too, the cooling module 42 is pressed against the circuit component 33 by taking advantage of the coupling of the first substrate 24 and the second substrate 25. The assembly of the cooling device 21 is ended.

Inversely, when the first substrate 24 is detached from the second substrate 25 fixed to the housing 16 or the cooling device 21 and the substrate unit 22 are disassembled, the first substrate 24 can easily be detached by only removing the four screws 53.

The above is the embodiment of the portable computer 11. According to the present embodiment, the circuit component 33 serving as the cooled element and the cooling module 42 can be arranged, respectively, on the first substrate 24 and the second substrate 25, separately from each other. For this reason, the first substrate 24 itself can be formed not to include the cooling module 42. Therefore, the first substrate 24 can be made thin.

The circuit component 33 is mounted at the opposite face of the first substrate 24 to the second substrate 25. For this reason, in the state in which the circuit component 33 is embedded in the substrate unit 22, the circuit component 33 is sandwiched between the first substrate 24 and the second substrate 25. Impulse can be thereby prevented from applying directly to the circuit component 33.

The main body 42a of the cooling module 42 is fixed to the second face 41b of the second substrate 25. Thus, the main body 42a of the cooling module 42 is not arranged between the first substrate 24 and the second substrate 25, and a gap between the first substrate 24 and the second substrate 25 can be made small. Therefore, the substrate unit 22 can be made thin. In addition, since the projecting portion 42b is fitted in the opening portion 45 of the second substrate 25, the substrate unit 22 can be made thin, too.

By the coupling member 26, the first substrate 24 and the second substrate 25 are coupled and the projecting portion 42b of the cooling module 42 is pressed against the circuit component 33. Thus, coupling the first substrate 24 and the second substrate 25, and pressing the cooling module 42 against the circuit component 33 can be conducted simultaneously. Moreover, if the first substrate 24 is detached from the second substrate 25, the contact between the circuit component 33 and the cooling module 42 can be released. For this reason, when the first substrate 24 is detached from the second substrate 25, the cooling module 42 does not need to be detached from the first substrate 24.

In the present embodiment, the coupling member 26 not only couples the first substrate 24 and the second substrate 25, but also fixes the first substrate 24 and the cooling module 42. For this reason, the number of through holes such as elongated holes 34 provided at the first substrate 24 can be reduced. When the number of through holes is reduced, the total area necessary for the first ground portion 35 is also reduced and the space of the first substrate 24 can be saved.

The periphery of the circuit component 33 is surrounded by the edge portion 40 of the second substrate main body 41 which defines the opening portion 45. Thus, the periphery of the circuit component 33 can be protected by the first substrate 24 and the second substrate 25, and impulse can be prevented from applying directly to the circuit component 33 from the outside of the substrate unit 22.

The coupling member 26 is composed of the metal stop 51 and the pins 52, which are arranged at the opposite side of the cooling module 42 to the second substrate 25. The metal stop 51 has a spring characteristic. For this reason, the cooling module 42 can be elastically pressed against the circuit component 33 by the coupling member 26. If impulse is applied to the portable computer 11, the impulse can be absorbed by the metal stop 51 and the cooling module 42 can be thereby prevented from remaining in a state of abutting on the circuit component 33.

The first substrate 24 has the elongated holes 34 through which the screws 53 are passed, and the screws 53 can slide along the elongated holes 34. For this reason, the deformation of the metal stop 51 can be accepted by the first substrate 24. The spring characteristic of the metal stop 51 can be achieved sufficiently.

The metal stop 51 has the hemispherical projection 51A at the position corresponding to the projecting portion 42b of the cooling module 42 serving as the cooling member. The pushing pressure against the circuit component 33 can be thereby achieved, particularly, at the projecting portion 42b of the cooling module 42.

Each of the pins 52 has the step portion 52a abutting on the second substrate 25, and the distal portion 52b which extends from the step portion 52a to abut on the first substrate 24 through the second substrate 25. For this reason, a predetermined gap can be formed between the first substrate 24 and the second substrate 25. In addition, the second substrate 25 and the coupling member 26 do not need to be fixed by screws, etc., and the second substrate 25 can easily be sustained. Since the pins 52 are conductive, the first substrate 24 through the second substrate 25 can be earthed.

The circuit component 33 is composed of either the CPU or the graphics chip. For this reason, important components can be mounted on the first substrate 24. Thus, the user can easily upgrade the CPU and the graphics chip by only exchanging the first substrate 24. The cooling module 42 is not provided on the first substrate 24. For this reason, a manufacturer can provide a thin and cheap replacement for the first substrate 24 to the user.

The substrate unit 22 comprises the connector 27 making an electric connection between the first substrate 24 and the second substrate 25. For this reason, information can be exchanged between the first substrate 24 and the second substrate 25. In addition, if the connector 27 is employed for temporary fixation between the first substrate 24 and the second substrate 25, the fixation between the first substrate 24 and coupling member 26 can be conducted easily.

The cooling device 21 of the present embodiment comprises the cooling unit 23 including the cooling fins 56 and the fan 57. For this reason, the cooling of the substrate unit 22 can be further promoted.

Figure 6:
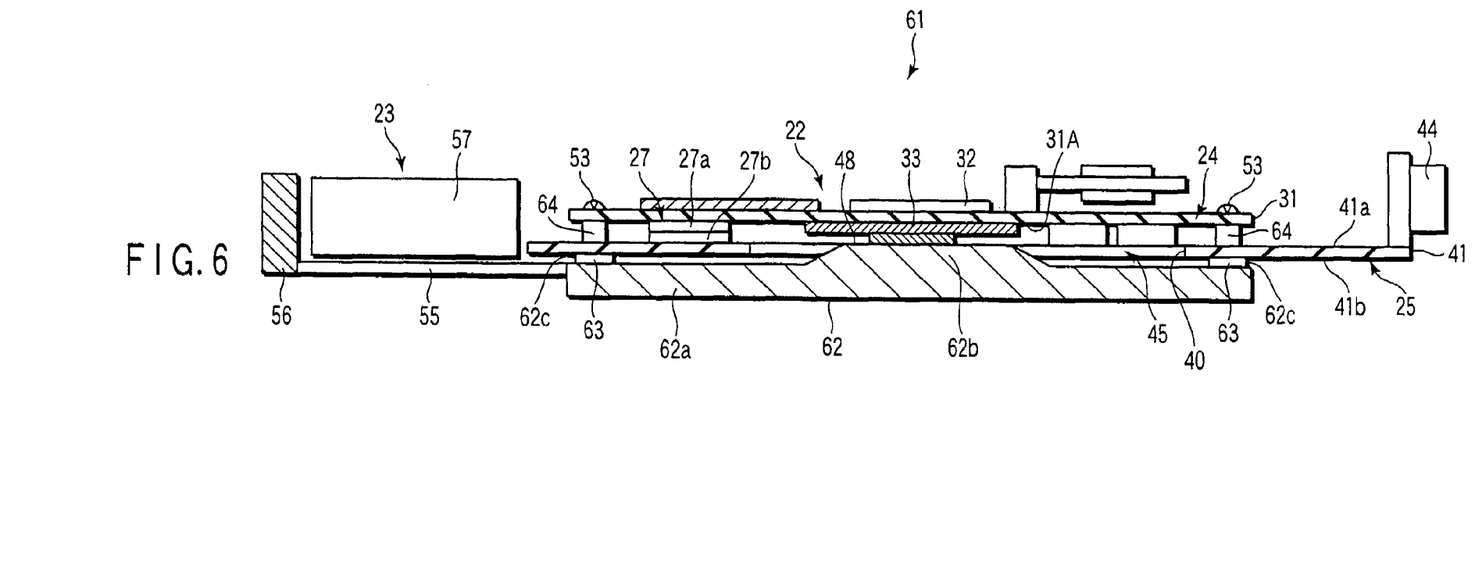
FIG. 6 is an exemplary cross-sectional view showing the cooling device according to a second embodiment of the present invention.

A cooling device 61 of a second embodiment is described with reference to FIG. 6. The cooling device 61 of the second embodiment is different from the cooling device of the first embodiment with respect to the structure of a cooling module 62 and a coupling member, but is common with respect to the other elements. For this reason, the different portions are mainly described below. The common elements are denoted by like or similar reference numbers and are not described here.

The cooling device 61 of a second embodiment comprises the substrate unit 22 and the cooling unit 23. The substrate unit 22 comprises the cooling module 62 serving as a cooling member. The cooling module 62 is formed of a heat-conductive aluminum alloy, etc. The cooling module 62 has a main body 62a fixed to the second face 41b, a projecting portion 62b fitted in the opening portion 45, and pins 62c serving as coupling members to fix the cooling module 62 to the first substrate 24. In other words, the coupling members are formed integrally with the cooling module 62 in the present embodiment.

The pins 62c project from four corners of the cooling module 62, respectively. Each of the pins 62c has a step portion 63 abutting on the second substrate 25, and a distal portion 64 which extends from the step portion 63 to abut on the first substrate 24 through the second substrate 25. The periphery of the pin 62c is coated with a conductive paint, which assigns electrical conduction to the pin 62c. The first substrate 24 and the second substrate 25 are thereby earthed.

In the cooling device 61 of the second embodiment, the cooling module 62 and the coupling members are molded integrally. For this reason, the coupling members are not needed separately, and the cooling device 61 can be formed easily. In addition, the metal stop 51 of the first embodiment is not needed in the present embodiment. For this reason, the tolerance of each of the cooling module 42, the metal stop 51 and the pins 52 needs to be considered to regulate the pushing pressure of the circuit component 33 in the first embodiment while the tolerance of the molded cooling module 62 alone needs only to be considered. For this reason, the pushing pressure of the cooling module 62 can be managed with high accuracy.

Figure 7:
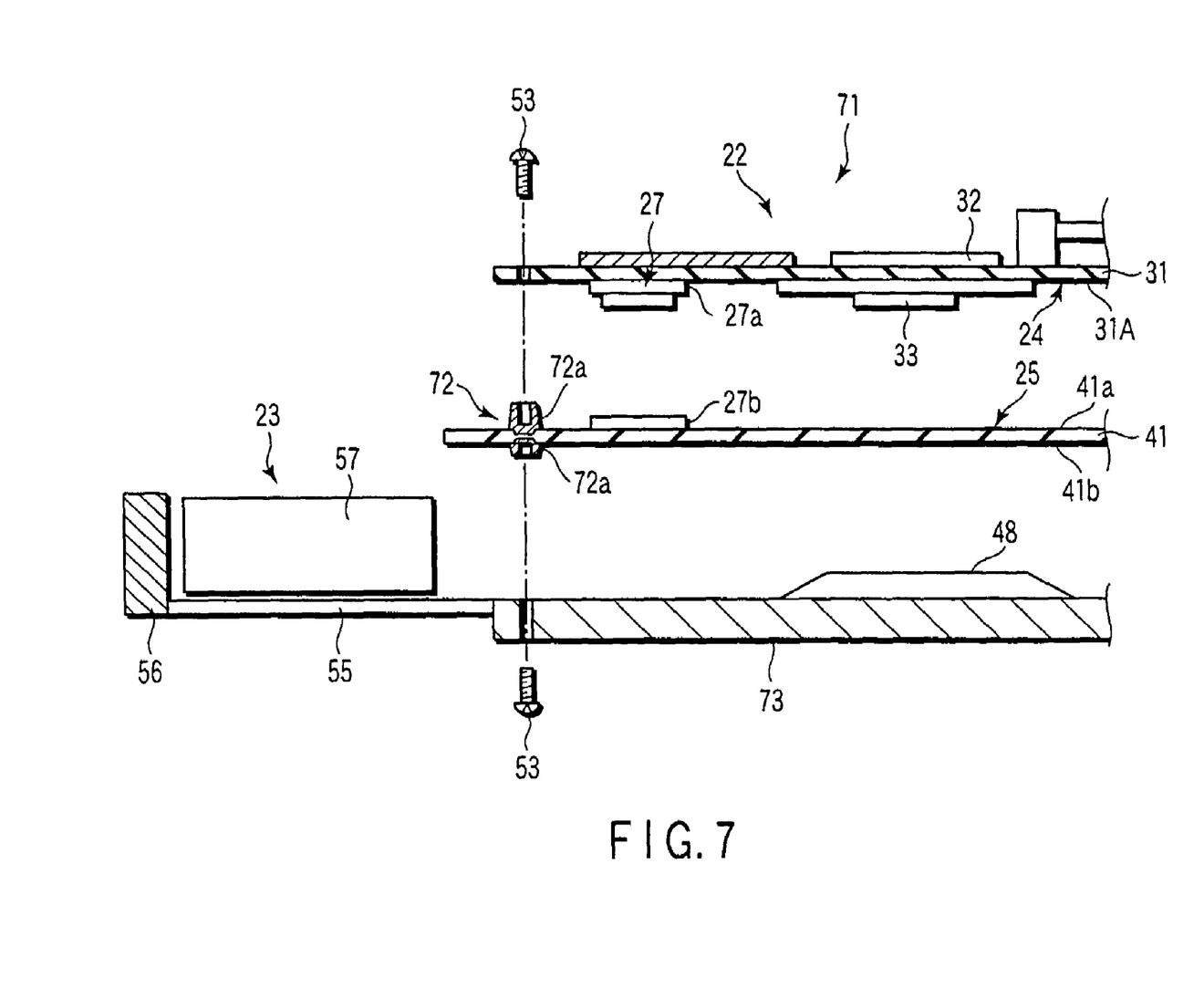
FIG. 7 is an exemplary exploded cross-sectional view showing the cooling device according to a third embodiment of the present invention.

A cooling device 71 of a third embodiment is described with reference to FIG. 7. The cooling device 71 of the third embodiment is different from the cooling device of the second embodiment with respect to the structure of the cooling device 71, the coupling member 72 and the cooling module 73. For this reason, the different portions to the second embodiment are mainly described below. The common elements to the second embodiment are denoted by like or similar reference numbers and are not described here.

The cooling device 71 of the third embodiment comprises the substrate unit 22 and the cooling unit 23. The substrate unit 22 has the first substrate 24, the second substrate 25 and the coupling members 72 which couple the first substrate 24 and the second substrate 25. Each of the coupling members 72 is composed of a stud 72a shaped in a cylinder and soldered on the second substrate 25. The studs 72a are provided at four portions on the first face 41a corresponding to the corners of the first substrate 24 and four portions corresponding to corners of the cooling module 73 on the second face 41b. Each of the studs 72a is conductive and allows the first substrate 24 and the second substrate 25 to be earthed. The first substrate 24 is fixed to the second substrate 25 by fixing the first substrate 24 to the studs 72a with the screws 53. In addition, the cooling module 73 is fixed to the second substrate 25 by fixing the cooling module 73 to the studs 72a with the screws 53.

In the cooling device of the third embodiment, the studs 72a which are the coupling members 72 can be mounted on the second substrate 25 by an automatic mounter. For this reason, the coupling members 72 can be preliminarily embedded in the second substrate 25.

The electronic device according to each of the above embodiments can be accomplished not only for the portable computer stated in the embodiments, but also for the other electronic devices such as a portable information terminal.

Figure 8:
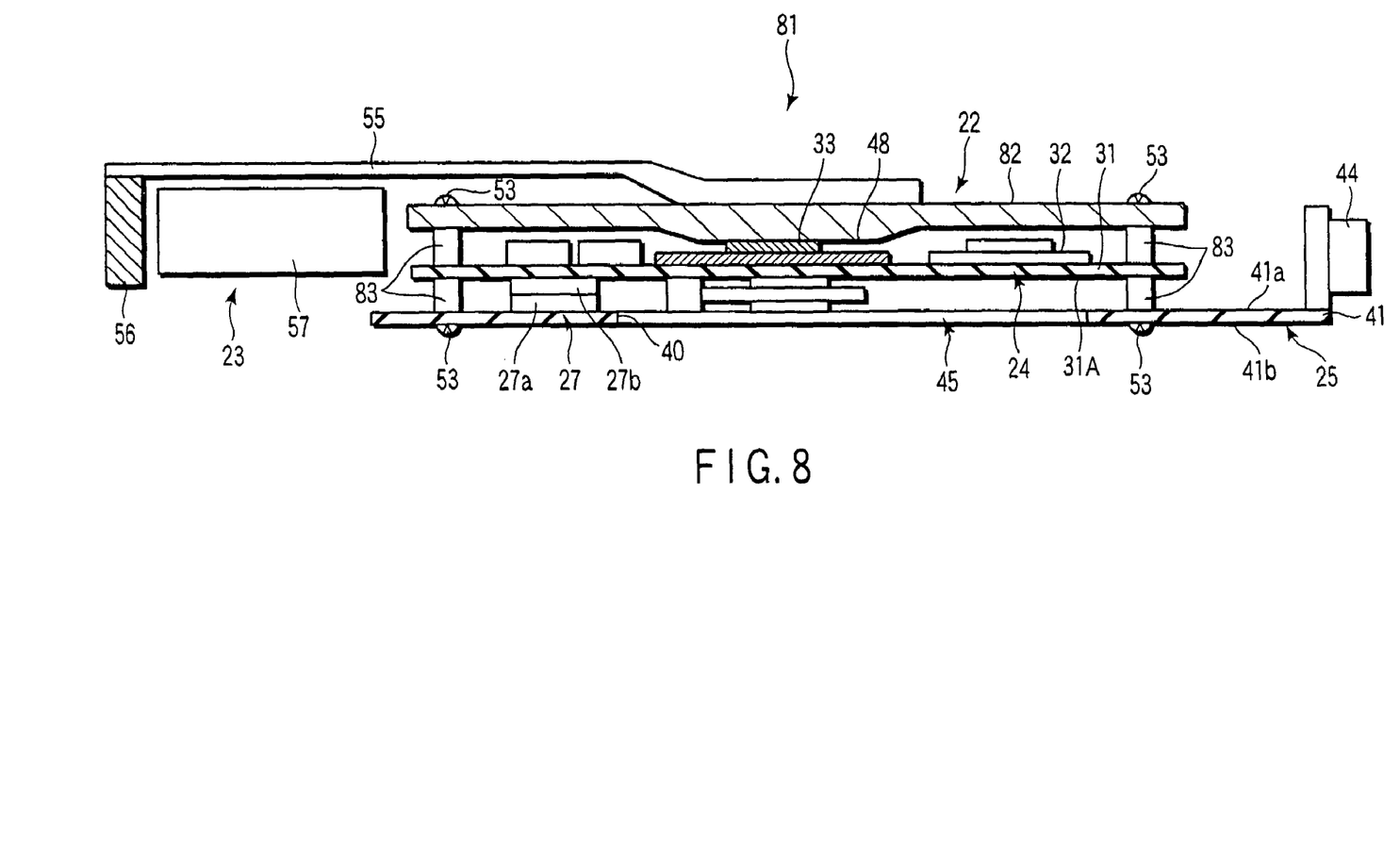
FIG. 8 is an exemplary cross-sectional view showing a modified embodiment of the cooling device.

The cooling devices 21, 61, 71 can be can be modified in various manners without departing from the spirit and scope of the invention. In other words, the cooling modules 42, 62, 73 are fixed to the second substrate 25 in the cooling devices 21, 61, 71 of the embodiments. As seen in a cooling device 81 shown in FIG. 8, however, a cooling module 82 can also be fixed to the first substrate 24. Otherwise, the above embodiments and their modified embodiments can be combined.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A substrate unit, comprising:
   a first substrate having a first substrate main body and a circuit component;
   a second substrate having a second substrate main body, an opening portion provided at the second substrate main body, and a cooling member cooling the circuit component; and
   a coupling member coupling the first substrate and the second substrate to allow the first substrate and the second substrate to be opposite to each other,
   the circuit component being mounted on a face of the first substrate main body which is opposite to the second substrate,
   the second substrate main body having a first face which is opposite to the first substrate, and a second face which is opposite to the first face,
   the cooling member having a main body and a projecting portion which projects from the main body, and
   the coupling member fixing the main body of the cooling member to the second face of the second substrate main body, and coupling the first substrate and the second substrate so as to fit the projecting portion of the cooling member in the opening portion and press the projecting portion thereof against the circuit component.

2. The substrate unit according to claim 1, wherein a periphery of the circuit component is surrounded by an edge portion of the second substrate main body defining the opening portion.

3. The substrate unit according to claim 1, wherein the coupling member has:
   a metal stop positioned at an opposite side of the cooling member to the second substrate main body, and having a plurality of corners; and
   a pin projecting from each of the corners of the metal stop, and fixed to the first substrate through the second substrate, and
   the metal stop has a spring characteristic.

4. The substrate unit according to claim 3, wherein
   the coupling member has a screw to fix the pin and the first substrate,
   the first substrate main body has an elongated hole through which the screw passes, and
   the screw slides along the elongated hole.

5. The substrate unit according to claim 3, wherein the metal stop has a hemispherical projection at a position corresponding to the projecting portion of the cooling member.

6. The substrate unit according to claim 3, wherein the pin has:
   a step portion abutting on the second substrate; and
   a distal portion extending from the step portion and abutting on the first substrate through the second substrate.

7. The substrate unit according to claim 3, wherein the pin is conductive.

8. The substrate unit according to claim 1, wherein
   the coupling member is a pin molded integrally with the cooling member; and
   the pin projects from each of the corners of the cooling member, and fixed to the first substrate through the second substrate.

9. The substrate unit according to claim 8, wherein the pin has:
   a step portion abutting on the second substrate; and
   a distal portion extending from the step portion and abutting on the first substrate through the second substrate.

10. The substrate unit according to claim 8, wherein the pin is conductive.

11. The substrate unit according to claim 1, wherein the circuit component is any one of a central processing unit and a graphics chip.

12. The substrate unit according to claim 1, further comprising a connector making an electric connection between the first substrate and the second substrate.

13. A cooling device, comprising:
   a substrate unit; and a cooling unit which promotes cooling of the substrate unit, the substrate unit comprising:

a first substrate having a first substrate main body and a circuit component;

a second substrate having a second substrate main body, an opening portion provided at the second substrate main body, and a cooling member cooling the circuit component; and a coupling member coupling the first substrate and the second substrate to allow the first substrate and the second substrate to be opposite to each other, the circuit component being mounted on a face of the first substrate main body which is opposite to the second substrate, the second substrate main body having a first face which is opposite to the first substrate, and a second face which is opposite to the first face, the cooling member having a main body and a projecting portion which projects from the main body, and the coupling member fixing the main body of the cooling member to the second face of the second substrate main body, and coupling the first substrate and the second substrate so as to fit the projecting portion of the cooling member in the opening portion and press the projecting portion thereof against the circuit component.

14. The cooling device according to claim 13, wherein the cooling unit comprises:

a heat pipe communicating with the cooling member;

cooling fins communicating with the heat pipe; and a fan blowing air toward the cooling fins.

15. The cooling device according to claim 13, wherein a periphery of the circuit component is surrounded by an edge portion of the second substrate main body defining the opening portion.

16. The cooling device according to claim 13, wherein the coupling member has:

a metal stop positioned at an opposite side of the cooling member to the second substrate main body, and having a plurality of corners; and a pin projecting from each of the corners of the metal stop, and fixed to the first substrate through the second substrate, and the metal stop has a spring characteristic.

17. The cooling device according to claim 16, wherein the metal stop has a hemispherical projection at a position corresponding to the projecting portion of the cooling member.

18. An electronic device, comprising:

a housing; and a cooling device contained in the housing, the cooling device including a substrate unit, and a cooling unit which promotes cooling of the substrate unit, the substrate unit comprising:

a first substrate having a first substrate main body and a circuit component;

a second substrate having a second substrate main body, an opening portion provided at the second substrate main body, and a cooling member cooling the circuit component; and a coupling member coupling the first substrate and the second substrate to allow the first substrate and the second substrate to be opposite to each other, the circuit component being mounted on a face of the first substrate main body which is opposite to the second substrate, the second substrate main body having a first face which is opposite to the first substrate, and a second face which is opposite to the first face, the cooling member having a main body and a projecting portion which projects from the main body, and the coupling member fixing the main body of the cooling member to the second face of the second substrate main body, and coupling the first substrate and the second substrate so as to fit the projecting portion of the cooling member in the opening portion and press the projecting portion thereof against the circuit component.

19. The electronic device according to claim 18, wherein a periphery of the circuit component is surrounded by an edge portion of the second substrate main body defining the opening portion.

20. The electronic device according to claim 18, wherein the coupling member has:

a metal stop positioned at an opposite side of the cooling member to the second substrate main body, and having a plurality of corners; and a pin projecting from each of the corners of the metal stop, and fixed to the first substrate through the second substrate, and the metal stop has a spring characteristic.

* * * * *